(12) United States Patent
Waldner (10) Patent No.: US 6,717,247 B1
(45) Date of Patent: Apr. 6, 2004

(54) TOOL AND METHOD FOR WELDING TO IC FRAMES

(76) Inventor: Kurt Waldner, 329 Hampton St., Salinas, CA (US) 93906

( * ) Notice: Subject to any disclaimer, the term of this patent is extended or adjusted under 35 U.S.C. 154(b) by 0 days.

(21) Appl. No.: 10/190,826

(22) Filed: Jul. 5, 2002

Related U.S. Application Data

(63) Continuation-in-part of application No. 10/097,528, filed on Mar. 13, 2002.

(51) Int. Cl.[7] ............................................... H01L 23/02
(52) U.S. Cl. ........................ 257/678; 257/727; 257/698; 257/666; 257/667
(58) Field of Search ................................ 257/667, 666, 257/698, 727, 678

(56) References Cited

U.S. PATENT DOCUMENTS

| | | | | | |
|---|---|---|---|---|---|
| 5,095,187 | A | * | 3/1992 | Gliga | 219/68 |
| 5,395,226 | A | * | 3/1995 | Sakai et al. | 425/116 |
| 5,558,883 | A | * | 9/1996 | Shinada et al. | 425/116 |
| 5,885,852 | A | * | 3/1999 | Kishikawa et al. | 438/117 |
| 5,985,693 | A | * | 11/1999 | Leedy | 438/107 |
| 6,062,459 | A | * | 5/2000 | Sabyeying | 228/4.5 |
| 6,147,335 | A | * | 11/2000 | Von Arx et al. | 219/544 |
| 6,336,269 | B1 | * | 1/2002 | Eldridge et al. | 29/885 |
| 6,428,300 | B2 | * | 8/2002 | Lajza et al. | 425/116 |
| 6,436,318 | B1 | * | 8/2002 | McFarland et al. | 264/39 |
| 6,564,447 | B1 | * | 5/2003 | Seng | 29/827 |
| 6,616,880 | B2 | * | 9/2003 | Thummel | 264/272.13 |

* cited by examiner

Primary Examiner—Van Thu Nguyen
Assistant Examiner—Doug Menz
(74) Attorney, Agent, or Firm—Robert Samuel Smith (57) ABSTRACT

A device for forming an encapsulated end of a wire bonded to a metal surface. The device includes a clamp being an end surface of a bar is pressed against a surface of a plate. The end surface has a ridge formed around its edge. Therefore, when a clamping force is applied to the bar against the plate, the metal sheet clamped between the plate surface and end surface of the bar, the clamping force is concentrated at an interface between the metal surface and ridge. When encapsulate is injected into the contact region, the ridge prevents contaminating material from migrating over interface between bar and plate where the welding step is to be performed. The bar is then withdrawn leaving a tunnel through which the wire is positioned with the end of the wire in contact bondable to the clean surface of metal. The wire is positioned in the tunnel and bonded to the metal surface.

15 Claims, 6 Drawing Sheets

PROVIDE MOLD WITH CLAMP OF PLATE AND BAR

CLEAN METAL SURFACE

CLAMP METAL SHEET IN MOLD

INJECT ENCAPSULATING MEDIUM

WITHDRAW CLAMPING BAR, LEAVING TUNNEL

INSERT WIRE IN TUNNEL

SEVER WIRE

FILL TUNNEL IN SECOND ENCAPSULATING STEP

TOOL AND METHOD FOR WELDING TO IC FRAMES

CROSS REFERENCE TO EARLIER APPLICATIONS

This application is a contiuation-in-part of application 10/097,528 filed Mar. 13, 2002 from which priority is claimed

FIELD OF THE INVENTION

This invention relates to manufacturing integrated circuits and particularly to a tool and method for butt welding a wire to an integrated circuit frame.

BACKGROUND AND INFORMATION DISCLOSURE

Fabrication of semiconductor devices includes two areas of operations: forming electrical contacts between wires and terminals of components, and packaging, i.e., encasing the device in a plastic or ceramic enclosure to provide mechanical support and protection from the environment.

Contacts between a wire or pin and a pad (terminal) generally fall into two categories: permanent and temporary.

In permanent applications, the requirement is to secure an end of a wire to a pad. The pad is the surface of a lead frame or the terminal of a semiconductor die. Methods used to permanently bond the end of the wire to such terminations include soldering and ultrasonic welding.

Contacts of a temporary nature include contacts of conductors to terminals of a test circuit where contact is maintained only during a brief test procedure. In this application, the test wire is commonly supported in a manner wherein the wire maintains a resilient (springlike) force against the terminal of the device under test.

Numerous techniques for forming permanent and compressive bonds have been disclosed in the Patent literature.

U.S. Pat. No. 3,460,238 discloses a technique whereby the wire severing operation comprises moving the needle with holding pressure sufficient to frictionally engage the wire and insufficient to deform the wire away from the bond area.

U.S. Pat. No. 3,73,481 to Lins et al discloses forming pin-like gold pedestal structures atop terminal portions of an n integrated circuit device by thermocompressing gold spheres and shaping the spheres with a heated vacuum holder.

U.S. Pat. No. 5,095,187 to Gliga discloses a wire-bonding technique involving a combination of heat, pressure and vibration. This patent discusses weakening or severing the wire by localized application of heat and how the severing operation may result in a broadened portion on the severed end of the wire U.S. Pat. No. 6,062,459 to Sabyeying discloses a wirebond clamp for holding fingers of lead frames against a heater block. The clamp includes a base plate having an array of apertures for the lead wires.

U.S. Pat. No. 6,336,269 to Eldridge et al discloses a flexible elongate member (such as a gold wire) mounted on a contact area and is configured to have a springable shape, such as a wire stem having at least one bend.

Packaging is an important part of semiconductor technology wherein the object of the package is to confer mechanical stability and protection from the environment on a circuit comprising a plurality of electrical connections between electronic components.

Ceramic packages are required where long life of the encapsulated device is required. Plastic packaging of the circuit is practiced where cost is an important consideration with some degree of mechanical stability and protection from the environment.

Intensive research into packaging techniques has been directed toward the development of polymer composites that have improved thermal resistance, lower coefficients of thermal expansion, reduced moisture absorption characteristics. More recently efforts have been directed toward the development of three-dimensional packages. Numerous patents are directed toward these efforts.

For example, U.S. Pat. No. 5,985,693 to Leedy is directed toward fabrication of integrated circuits from flexible membranes formed of very thin low stress dielectric materials and semiconductor materials.

U.S. Pat. No. 6,147,335 to Von Arx discloses various components of thermal systems molded within a polymer sheath. The use of transfer and compression molding allows for the use of thermoset polymers containing very high levels of reinforcement fillers.

In a related configuration, it is required to form electrical connection of the ends of wires to respective fingers of a lead frame. Attempts to form such contacts involve forming a permanent bond of the end of a wire or pin to the broad surface of the finger. Encasing the contact in a plastic after the contact is formed is difficult to carry out because of the mechanical forces exerted on the contact during the subsequent molding process.

Ultrasonic bonding the tip of a wire or pin to the broad surface of a lead of a lead frame requires that the surface of the lead be scrupulously clean in order to obtain a strong bond.

SUMMARY OF THE INVENTION

It is an object of this invention to provide a tool and process for forming a permanent bond of the tip of one or more wires or pins to the surface of a metal sheet.

It is a further object of the invention that the contact(s) be encapsulated in a resin medium.

It is a further object that, in forming the contact to the surface of the metal to which the tips are bonded the surface of the metal be devoid of contaminating films including oxidized films that would diminish the strength of the bond. It is contemplated that a particular application of the method and tool be to the formation of wires and pins bonded to the leads of a led frame.

This invention is directed toward a process which begins with cleaning the surface of the lead frame and then providing a clamp The clamp has any one of several embodiments.

In one embodiment, the clamp has one jaw that is a plate having a flat clamping surface facing another other jaw being a (preferably round) bar. The clamping surface of the bar, (i.e., the end of the bar facing the clamping surface of the plate) has a raised rim around its circumference.

In another embodiment, the one jaw is also a bar (instead of a plate) having a flat end surface and the two bars (aws) are aligned.

According to various versions of the invention, either or both jaws are moveable toward and away from one another.

When the sheet is clamped between the clamping surfaces, a casting medium is forced under high pressure into the cavity surrounding the jaws clamped together. The clamping force between the jaws is concentrated at the ridge of one jaw toward the clamping surface of the second jaw and is generally sufficient to indent the surface of the metal between the jaws. In practice, the pressurized encapsulating medium is forced into the cavity, which includes the jaws in contact with one another. However, the ridge) prevents the encapsulating medium from leaking into the interface between the clamping surfaces of the jaws.

When the clamp (bar and plate} are withdrawn from the casting, there is left a package including the lead frame with attached lead encapsulated in the casting medium. An open column leads from the surface of the lead to the outer surface of the package. The surface of the lead has been kept free of encapsulating by virtue of the configuration of the clamping surfaces in accordance with the invention.

In a second step of the process, a wire (or pin) is inserted into the open end of the column and into contact with the surface of the lead frame on the opposite end of the open column.

Ultrasonic energy is then applied to the wire so as to ultrasonically bond the wire to the lead frame.

The open column enclosing the bonded wire is then impregnated in a second encapsulating step so as to seal the wire in position welded to the lead frame thereby completing the packaging operation. A crucial feature in the foregoing process is the use of the hold down bar with the raised rim around the edge that effectively prevents the liquefied encapsulating medium from contaminating the surface of the lead which would otherwise interfere with formation of the bond between the surface of the lead and the wire tip.

DESCRIPTION OF A PREFERRED MODE

Figure 1A:
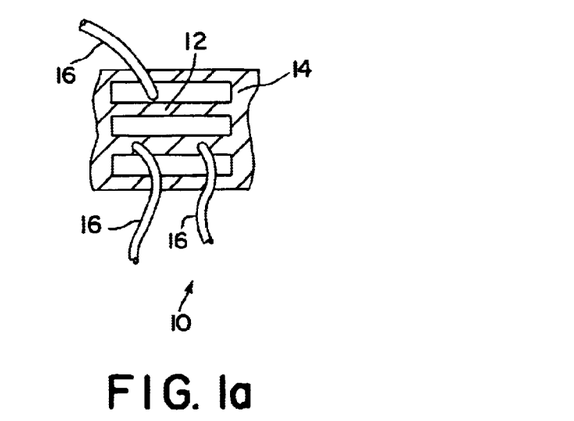
FIG. 1a shows a lead frame.
Figure 1B:
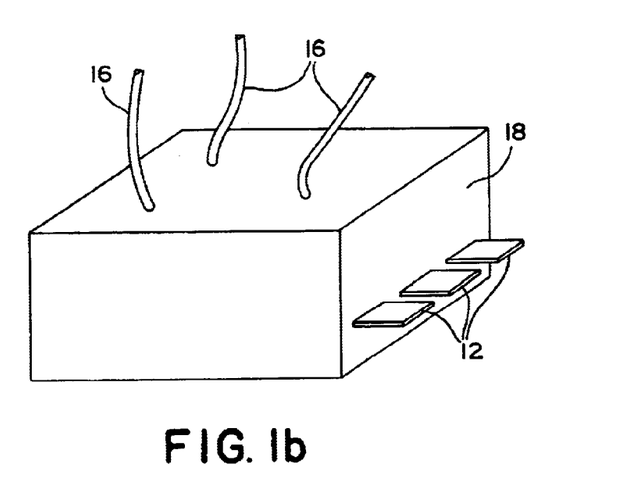
FIG. 1b shows the encapsulated circuit.

Turning now to a discussion of the drawings, FIG. 1a shows a lead frame 10 (well known in the art) being a metal lamination etched or stamped to form an array of leads 12, each lead 12 having an outer end integrally joined to a surrounding frame 14. There is also shown an array of wires 16 (three are shown) each wire 16 bonded at a selected location for the respective wire. The circuit is entirely hermetically sealed in an encapsulating medium to form a molding 18 as shown in FIG. 1b.

Figure 2:
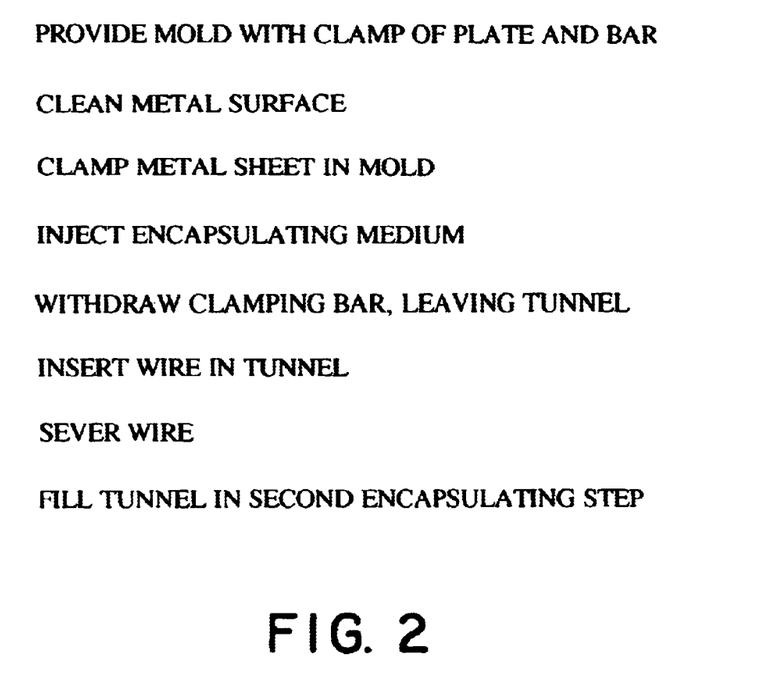
FIG. 2 is a flow chart illustrating the method of the invention.

The steps forming the encapsulated circuit of FIG. 1a are listed in the flow chart of FIG. 2 and illustrated in FIGS. 3–6.

In step 1, the lead frame with leads shown in FIG. 1a is formed by techniques well known in the art. The process includes leaving the surface of the lead frame 10 in a "clean" condition that is suitable for forming a bond of a wire 16 to the surface of the lead frame 14 using the ultrasonic bonding technique. In step 2, as shown in the sectional view of FIG. 3, the lead 12 of lead frame 10 is clamped in a clamp including a plate 20 (one jaw) and an opposing jaw 22.

Figure 3:
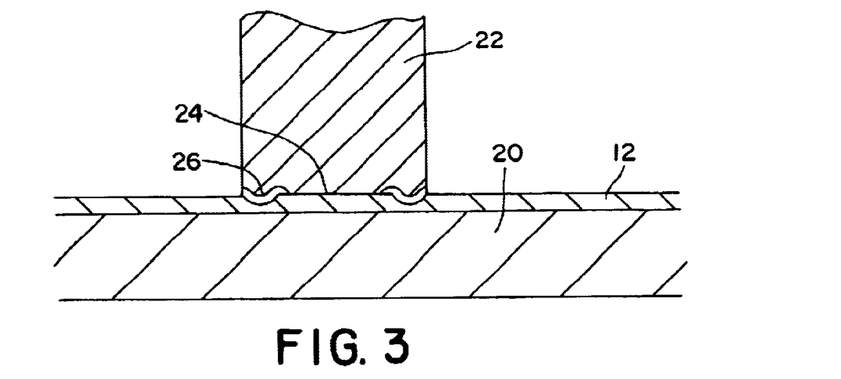
FIG. 3 shows details of the clamping surface of the bar.

The opposing jaw 22 is a round bar with one end 24 being the clamping surface. The clamping surface 24 on the end of the bar 22 has a ridge 26 extending around the edge of the clamping surface 24.

Figure 4:
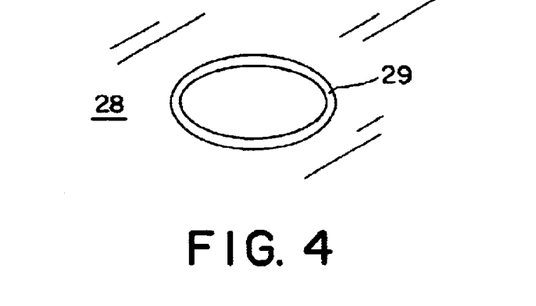
FIG. 4 is a perspective view showing deformation of the lead surface and details of the mold structure.

FIG. 4 is a perspective view showing the surface 28 of the lead 12 deformed leaving a circular depression 29 in response to the force of the ridge 26 against the surface of the metal. The circular depression in the metal finger of the frame indicates to an inspecteor that sufficient pressure has been applied during the manufacturing process to prevent leakage of encapsulating medium into the interface.

Figure 5:
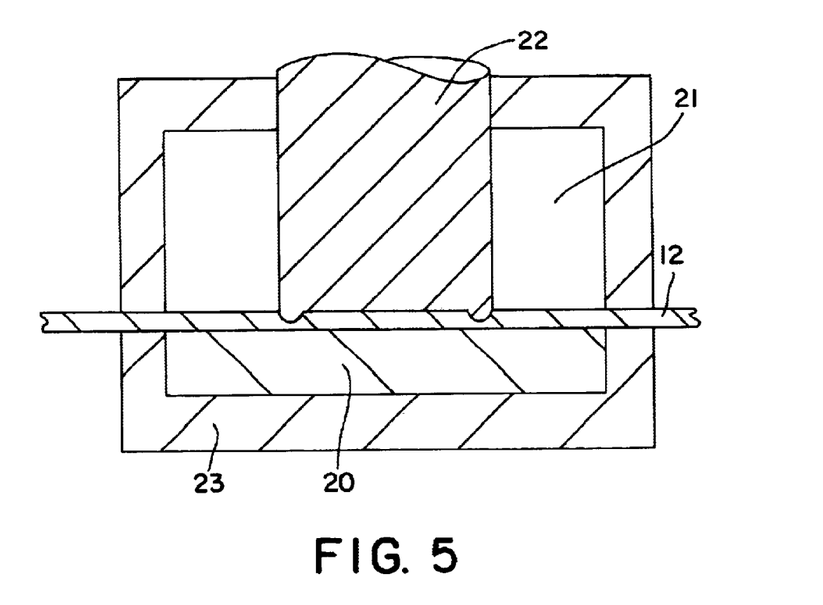
FIG. 5 shows the clamp in the encapsulating mold.

FIG. 5 is a sectional view showing that the plate 20 and bar 22 forming the clamp is inside the cavity 21 of a mold 23 to be filled with encapsulating medium. The bar is spring loaded (spring not shown) thereby providing a controlled predetermined force of the end of the bar against the surface of the metal lead when the mold is closed.

Figure 6:
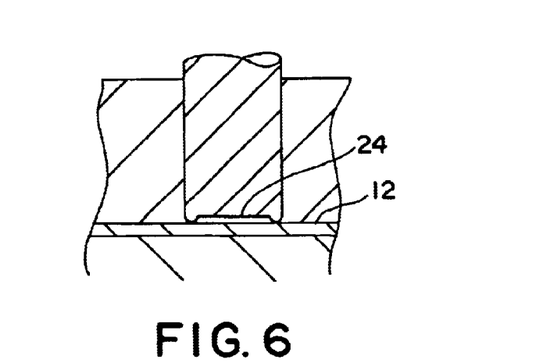
FIG. 6 shows a sectional view of the lead surface without the benefit of the ridge illustrating contamination by encapsulate of the lead surface.

In step 3. an encapsulating medium is injected into the cavity. The encapsulating medium is any one of a number of polymer/ceramic encapsulating media that are well known in the art of injection molding. The ridge 26 of bar 22 forced against the lead 12 forms an intimate contact between the ridge on the end face of bar so as to prevent encapsulating medium from being forced in between the bar and metal surface of the lead 12. FIG. 6 shows that, when there is no ridge on the end of the bar) the liquid encapsulating medium is forced between the end surface 24 of the bar and the lead 12.

In contrast to FIG. 6, the surface of the lead 12 shown in FIG. 5 remains clean and is ready for subsequent wire bonding thereto whereas the surface of the lead shown in FIG. 6 is contaminated by encapsulating medium and must be cleaned by additional steps before ultrasonic bonding can be performed to the surface.

Figure 7:
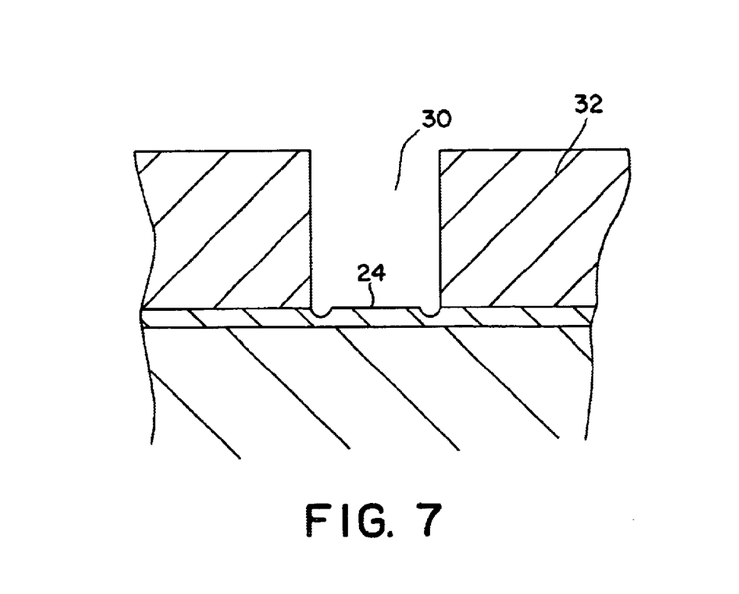
FIG. 7 is a sectional view showing the tunnel formed by the bar clamp.

In step 4, the clamping bar is withdrawn from the plate, leaving the encapsulated frame in the mold cavity. FIG. 7 is a sectional view showing the tunnel 30 left in the encapsulating medium 32 after the bar 20 is withdrawn from the plate. The tunnel 30 extends from the (exposed) surface 24 of the metal lead 12 to the outer surface of the molding 32.

Figure 8:
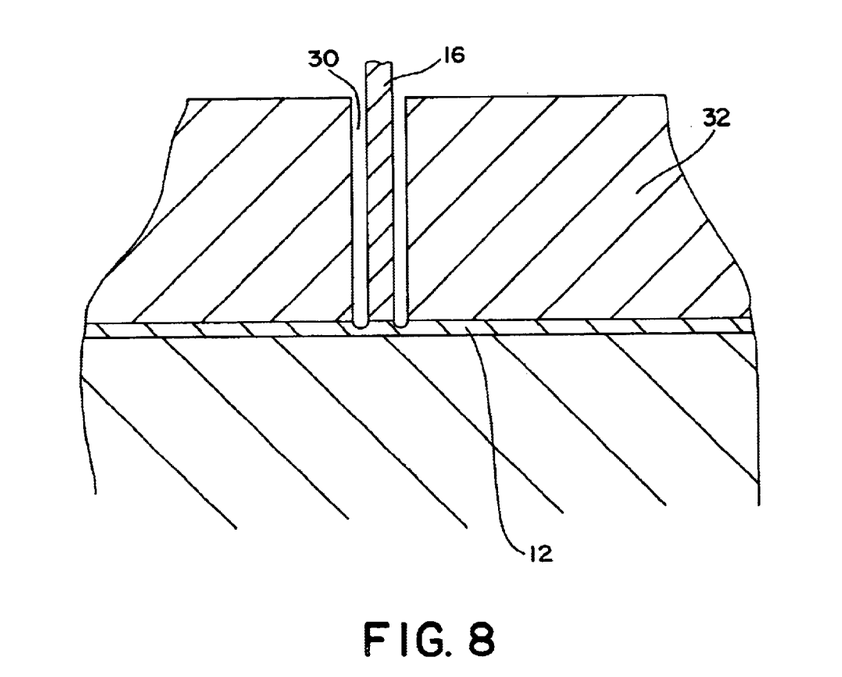
FIG. 8 shows the wire positioned in the tunnel.

In step 5, as shown in FIG. 8, a wire 16 is inserted into the tunnel 30 wherein one end of the wire is in contact with the surface of the lead 12 and the other end of the wire 16 extends out of the open end of the tunnel 30.

In step 6 either one or a combination of ultrasonic/bonding energy is applied to weld the tip of the wire to the lead.

In step 7; the wire is severed leaving an end of the wire extending out of the open end of the tunnel.

Figure 9:
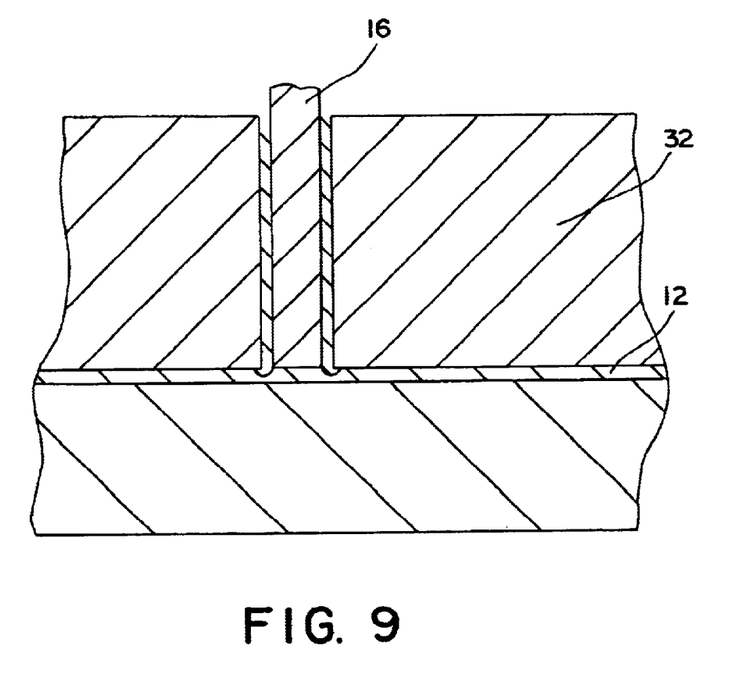
FIG. 9 shows the tunnel backfield with encapsulate.

In step 8, as shown in the sectional view of FIG. 9, a second encapsulating step is performed to fill the tunnel with encapsulate 33 and securing the wire in place.

A major feature of the invention is the specially formed clamping bar with ridge formed on the perimeter of the clamping surface. This feature is very effective in eliminating several expensive steps that would otherwise be required to prepare the surface of the lead for bonding thereto.

Variations and modifications of this invention may be contemplated after reading the specifications and studying the drawings, which are within the scope of the invention. The scope of the invention includes not only the process of making the circuit but also the method of making the bar (clamp) having a ridge on the end. In one embodiment the bar is a tube. This configuration has the advantage of great convenience in being able to frequently sharpen the end of the bar (tube) to maintain the required ridge configuration.

It is contemplated that a single mold can be used for numerous versions of a circuit within the molded package. Such a mold is illustrated in FIG. 9 where there is shown a plate holding an array of bores. Selected bores each hold a spring and one end of a bar. The bores are selected according to the required circuit. Each Bore that is not selected for forming contact with a lead contains a plug.

It should be understood, in the context of the specification that the "plate 20 (one jaw) of FIG. 3 is any member of the mold that provides a support to the lead and the bar. In this context, the "plate" in one embodiment is an end of an opposing bar or the internal surface of a mold or a member of any configuration that provides the required backup support.

Figure 10A:
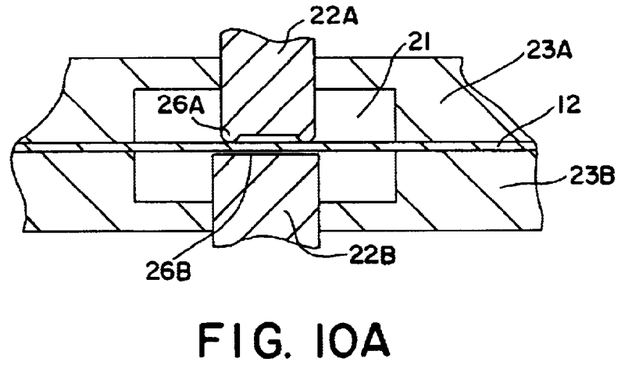
FIG. 10A and 10B are sectional views of a mold having opposing pins.

For example, FIG. 10A is a sectional view showing a version of the invention where both jaws of the clamp holding the lead frame are aligned bars 22A,B. enclosed in the cavity 21 of mold section 23A interfacing mold section 23B. The lead frame 12 (metal sheet) is shown. One jaw of the clamp is the bar 22A with the ridge 26A on its flat end surface 25A. The other jaw is another bar 22B having a flat end surface 25B. In another version, shown in FIG. 10B the flat end surface 25 B also has a ridge 26B. Either or both bars 22A,B are slideable in the wall of mold 23A. 23B respectively.

Figure 10B:
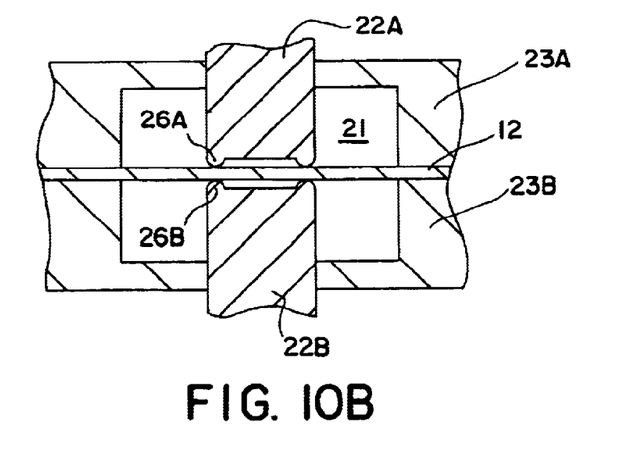
Figure 11:
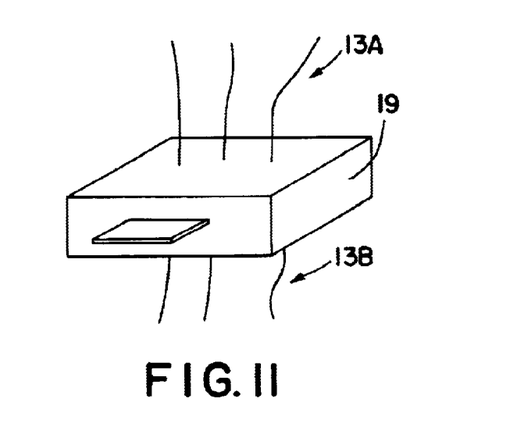
FIG. 11 shows an IC package with leads extending from opposing sides.

The molds shown in FIGS. 10A, B are adapted to form the component IC 19, shown in FIG. 11 which has two sets of two lead wires 13A,B. One set 1A of lead wires bonded to a lead on one side of the frame and another set of lead wires 13B bonded to an opposite side of the same lead and extending from an opposite side of the IC.19.

Figure 12:
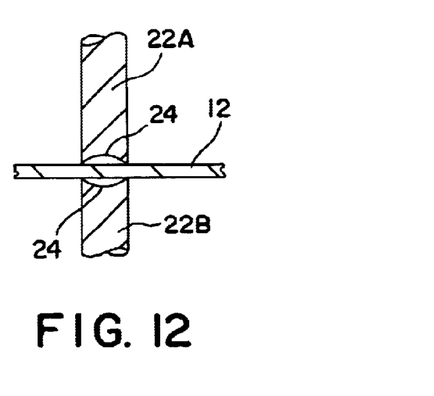
FIG. 12 shows a pin of this invention having a generally concave surface.

FIG. 12 is a sectional view in which the opposing opposing end surfaces of the pins have a generally concave shape providing that the clamping force on the metal sheet between the pins is concentrated at the edges of the end surfaces.

In view of these versions, I therefore wish to define my invention by the appended claims.

I claim:

1. A device for forming an encapsulated circuit, said circuit including at least one wire with an end and a metal sheet having a metal surface, said end bonded to said metal surface, said device comprising:

a mold having two mold parts which form a cavity when a parting surface of said one mold part interfaces a parting surface of said another mold part;

said mold arranged to permit positioning said metal sheet between said parting surfaces and extending into said cavity;

a clamp having a pair of jaws, one jaw with one clamping surface facing another jaw with another clamping surface;

said clamp arranged to clamp onto said metal sheet inside said cavity, with said one jaw on one surface of said metal sheet and said another jaw on an opposite surface of said metal sheet;

said one jaw being one bar extending into said cavity from a cavity surface of one said mold part;

said one bar having one end surface being one said clamping surface inside said cavity;

one ridge formed on said one end surface along a corner edge of said one bar;

said one ridge arranged to abut said one metal surface when said metal sheet is clamped between said pair of jaws providing that clamping force is concentrated on said one metal surface along said one ridge;

said ridge arranged to prevent leakage into an interface, between said one metal surface and said one bar, of an encapsulating medium injected into said cavity to provide a molding, after being extracted from said cavity, which includes said encapsulating medium containing a portion of said one metal surface and one tunnel through said encapsulating medium leading from outside said molding to said one metal surface inside said molding;

said one tunnel providing access for bonding an end of a wire to said one metal surface.

2. The device of claim 1 wherein an opposite end of said one bar is slidably positionable in a bore in a surface of said cavity.

3. The device of claim 2 wherein said another jaw is a plate secured to said another mold part and having a clamping surface facing said one jaw.

4. The device of claim 2 wherein said another jaw is another bar secured to said another mold part and having another clamping surface being an end of said another bar facing said one jaw.

5. The device of claim 4 wherein:

said another bar has another ridge formed on said another end surface around a corner edge of said another bar;

said another ridge arranged to abut an opposite metal surface when said metal sheet is clamped between said pair of jaws providing that clamping force is concentrated on said an opposite metal surface along said another ridge;

said another ridge arranged to prevent encapsulating medium leaking into an interface between said opposite metal surface and said another clamping surface to provide a molding, after being extracted from said cavity, which includes said encapsulating medium containing a portion of said metal sheet and another tunnel through said encapsulating medium leading from outside said molding to said metal surface inside said molding;

said another tunnel providing access for bonding an end of another wire to said opposite metal surface.

6. The device of claim 1 wherein said clamping force is sufficiently great to deform said metal surface.

7. The device of claim 1 further comprising means for bonding said end of said wire positioned in said tunnel to an area of said metal surface.

8. The device of claim 7 further comprising means for backfilling said tunnel with encapsulating medium.

9. The device of claim 3 wherein said metal surface is plated with a solder alloy and said means for bonding includes means for passing a current through said wire having an end in contact with said metal surface, said current being sufficient to solder said end of said wire to said metal surface.

10. The device of claim 1 wherein said bar is a tube providing that said ridge is an edge of said tube.

11. The device of claim 2 wherein said means for bonding comprises means for injecting ultra sonic energy into said interface.

12. The device of claim 8 wherein said wire is a rigid metal pin and said means for injecting ultrasonic energy comprises;

a source of ultrasonic energy;

means for coupling said source of ultrasonic energy to an end of said pin extending from said tunnel.

13. The device of claim 1 wherein said area is a lead of a lead frame.

14. A device for forming an encapsulated circuit, said circuit including at least one wire with an end and a metal sheet having a metal surface, said end bonded to said metal surface, said device comprising:

a mold having two mold parts which form a cavity when a parting surface of said one mold part interfaces a parting surface of said another mold part;

said mold arranged to permit positioning said metal sheet between said parting surfaces and extending into said cavity;

a clamp having a pair of jaws, one jaw with one clamping surface facing another jaw with another clamping surface;

said clamp arranged to clamp onto said metal sheet inside said cavity, with said one jaw on one surface of said metal sheet and said another jaw on an opposite surface of said metal sheet;

said one jaw being one bar extending into said cavity from a cavity surface of one said mold part;

said one bar having one end surface being one said clamping surface inside said cavity;

said end surface having a concave shape;

said end surface having an edge arranged to abut said one metal surface when said metal sheet is clamped between said pair of jaws providing that clamping force is concentrated on said one metal surface along said one edge;

said edge arranged to prevent leakage into an interface, between said one metal surface and said one bar, of an encapsulating medium injected into said cavity to provide a molding, after being extracted from said cavity, which includes said encapsulating medium containing a portion of said one metal surface and one tunnel through said encapsulating medium leading from outside said molding to said one metal surface inside said molding;

said one tunnel providing access for bonding an end of a wire to said one metal surface.

15. The device of claim 14 wherein said another jaw is another bar secured to said another mold part and having another clamping surface being an end of said another bar facing said one jaw;

said another surface having a concave shape providing that said another bar has another edge formed on said another end surface around a corner edge of said another bar providing that when said metal sheet is clamped between said pair of jaws a clamping force is concentrated on said an opposite metal surface along said another edge;

said another edge arranged to prevent encapsulating medium leaking into an interface between said opposite metal surface and said another clamping surface to provide a molding, after being extracted from said cavity, which includes said encapsulating medium containing a portion of said metal sheet and another tunnel through said encapsulating medium leading from outside said molding to said metal surface inside said molding;

said another tunnel providing access for bonding an end of another wire to said opposite metal surface.

* * * * *